(12) United States Patent  
Chauvin

(10) Patent No.: US 10,475,980 B2  
(45) Date of Patent: Nov. 12, 2019

(54) THERMOELECTRIC VEHICLE SYSTEM

(71) Applicant: LENR Cars SA, Ecublens (CH)

(72) Inventor: Nicolas Chauvin, Ecublens (CH)

(73) Assignee: LENR Cars SA, Ecublens (CH)

( * ) Notice: Subject to any disclaimer, the term of this patent is extended or adjusted under 35 U.S.C. 154(b) by 629 days.

(21) Appl. No.: 15/401,339

(22) Filed: Jan. 9, 2017

(65) Prior Publication Data

US 2018/0114890 A1 Apr. 26, 2018

Related U.S. Application Data

(63) Continuation-in-part of application No. 13/848,888, filed on Mar. 22, 2013, now Pat. No. 9,540,960.

(60) Provisional application No. 61/617,135, filed on Mar. 29, 2012.

(51) Int. Cl.  
*H01L 35/30* (2006.01)

(52) U.S. Cl.  
CPC ........ *H01L 35/30* (2013.01); *B60Y 2400/206* (2013.01)

(58) Field of Classification Search  
CPC ........ B60L 11/00; B60L 11/002; B60L 11/16; B60L 11/1805; B60L 11/1874; B60L 11/1875; B60L 11/1877; B60L 1/003; B60L 2200/10; B60L 2200/12; B60L 2200/18; B60L 2200/26; B60L 2200/32; B60L 2240/36; B60L 2240/445; B60L 2240/545; F01K 15/02; F01K 3/181; G21B 3/002; G21D 7/04; H01L 35/30; Y02T 10/7005; Y02T 10/705

See application file for complete search history.

(56) References Cited

U.S. PATENT DOCUMENTS

| | | |
|---|---|---|
| 4,072,186 A | 2/1978 | Barton |
| 5,172,784 A | 12/1992 | Varela, Jr. |
| 5,174,117 A | 12/1992 | Naito |

(Continued)

FOREIGN PATENT DOCUMENTS

| | | |
|---|---|---|
| BE | 1002780 | 6/1991 |
| BE | 1002781 | 6/1991 |

(Continued)

*Primary Examiner* — Jesse S Bogue  
(74) *Attorney, Agent, or Firm* — Neustel Law Offices

(57) ABSTRACT

A thermoelectric vehicle system which provides a cost-effective and sustainable means of transportation for long operation range with zero emission using an onboard low energy nuclear reaction thermal generator. The present invention generally includes a thermal generator within a thermal enclosure case, an energy conversion system linked with the thermal generator, an energy storage system linked with the energy conversion system, a cooling system and a central control system. The thermal generator reacts nickel powder with hydrogen within a reactor chamber to produce heat. The heat is then transferred to the energy conversion system to be converted into electricity for storage in the energy storage system. The cooling system provides cooling for the various components of the present invention and the control system regulates its overall operation. The present invention may be utilized to power a vehicle in an efficient, sustainable and cost-effective manner.

20 Claims, 8 Drawing Sheets

(56) References Cited

U.S. PATENT DOCUMENTS

| | | | | |
|---|---|---|---|---|
| 5,755,100 | A * | 5/1998 | Lamos | F02G 1/043 60/521 |
| 6,195,999 | B1 * | 3/2001 | Arnold | C01B 3/0005 60/649 |
| 6,536,207 | B1 * | 3/2003 | Kamen | B60K 6/00 60/39.6 |
| 8,726,661 | B2 * | 5/2014 | Spicer | F02G 1/043 60/299 |
| 9,038,388 | B2 * | 5/2015 | Almbauer | F01B 17/04 60/597 |
| 9,428,077 | B2 * | 8/2016 | Staley | B60L 1/003 |
| 2002/0017098 | A1 | 2/2002 | Johansson | |
| 2004/0045293 | A1 | 3/2004 | Freymann | |
| 2007/0056286 | A1 | 3/2007 | Schoell | |
| 2007/0056288 | A1 | 3/2007 | Schoell | |
| 2007/0056716 | A1 | 3/2007 | Schoell | |
| 2007/0206715 | A1 | 9/2007 | Godes | |
| 2007/0240650 | A1 | 10/2007 | Schoell | |
| 2007/0256664 | A1 | 11/2007 | Schoell | |
| 2007/0268045 | A1 | 11/2007 | Godes | |
| 2008/0041054 | A1 | 2/2008 | Montesinos | |
| 2008/0289335 | A1 | 11/2008 | Drysdale | |
| 2009/0090573 | A1 * | 4/2009 | Boone | B60L 50/62 180/65.245 |
| 2009/0277152 | A1 | 11/2009 | Sutherland | |
| 2009/0283007 | A1 | 11/2009 | Taylor | |
| 2009/0308072 | A1 * | 12/2009 | Kay | F02C 1/05 60/641.8 |
| 2010/0107637 | A1 | 5/2010 | Schoell | |
| 2010/0156112 | A1 * | 6/2010 | Held | F01K 3/185 290/1 A |
| 2010/0283262 | A1 | 11/2010 | Jensen | |
| 2011/0005506 | A1 * | 1/2011 | Rossi | C01B 3/00 126/263.01 |
| 2011/0122984 | A1 | 5/2011 | Godes | |
| 2011/0168467 | A1 | 7/2011 | Kamen | |
| 2011/0203267 | A1 * | 8/2011 | Ramming | F02G 1/043 60/525 |
| 2011/0233061 | A1 * | 9/2011 | Ahern | G21B 3/002 204/547 |
| 2011/0233990 | A1 | 9/2011 | Boncodin | |
| 2011/0249783 | A1 * | 10/2011 | Piantelli | G21B 3/002 376/146 |
| 2012/0122017 | A1 | 5/2012 | Mills | |
| 2012/0159951 | A1 * | 6/2012 | Avery | F01K 15/02 60/670 |
| 2013/0263597 | A1 * | 10/2013 | Chauvin | B60L 1/003 60/644.1 |
| 2013/0048045 | A1 | 12/2013 | Bayer | |
| 2014/0137562 | A1 * | 5/2014 | Law | F02C 7/00 60/772 |
| 2014/0373533 | A1 | 12/2014 | Jensen | |
| 2015/0110237 | A1 | 4/2015 | Cox | |
| 2015/0162104 | A1 * | 6/2015 | Soininen | G21B 3/002 376/108 |

FOREIGN PATENT DOCUMENTS

| | | |
|---|---|---|
| BE | 1003296 | 2/1992 |
| DE | 4129330 | 1/1993 |
| DE | 4132939 | 4/1993 |
| DE | 4336712 | 4/1994 |
| DE | 19732307 | 2/1998 |
| DE | 10013080 | 9/2001 |
| DE | 10243178 | 4/2004 |
| DE | 102008007159 | 9/2009 |
| EP | 0568118 | 3/1990 |
| EP | 0767962 | 9/1997 |
| EP | 1551032 | 6/2005 |
| EP | 1924387 | 9/2006 |
| EP | 2259998 | 4/2008 |
| EP | 2368252 | 5/2010 |
| EP | 2253808 | 11/2010 |
| EP | 1656678 B1 | 5/2011 |
| EP | 2368252 B1 | 1/2013 |
| EP | 2702593 B1 | 8/2015 |
| FR | 2570559 | 3/1986 |
| JP | H02310494 A | 12/1990 |
| JP | H0618683 A | 1/1994 |
| JP | H0675072 A | 3/1994 |
| WO | WO1990010935 | 12/1990 |
| WO | WO9300683 | 1/1993 |
| WO | WO9317437 | 9/1993 |
| WO | WO9428197 | 12/1994 |
| WO | WO9520816 | 8/1995 |
| WO | WO2004099599 | 11/2004 |
| WO | WO2007137268 | 11/2007 |
| WO | WO2008010998 | 1/2008 |
| WO | WO2008011036 | 1/2008 |
| WO | WO2008011038 | 1/2008 |
| WO | WO2008027364 | 3/2008 |
| WO | WO2009125444 | 10/2009 |
| WO | WO2010033927 | 5/2010 |
| WO | WO2012147045 | 11/2012 |

\* cited by examiner

THERMOELECTRIC VEHICLE SYSTEM

CROSS REFERENCE TO RELATED APPLICATIONS

The present application is a continuation-in-part of U.S. application Ser. No. 13/848,888 filed on Mar. 22, 2013, which claims priority to U.S. Provisional Application No. 61/617,135 filed Mar. 29, 2012. Each of the aforementioned patent applications, and any applications related thereto, is herein incorporated by reference in their entirety.

STATEMENT REGARDING FEDERALLY SPONSORED RESEARCH OR DEVELOPMENT

Not applicable to this application.

BACKGROUND OF THE INVENTION

Field of the Invention

The present invention relates generally to a thermoelectric vehicle system and more specifically it relates to a low energy nuclear reaction thermoelectric vehicle system which provides a cost-effective and sustainable means of transportation for long operation range with zero emission using an onboard low energy nuclear reaction thermal generator.

Description of the Related Art

Any discussion of the related art throughout the specification should in no way be considered as an admission that such related art is widely known or forms part of common general knowledge in the field.

The present invention relates to a system which utilizes thermal energy to power an electric vehicle, such as an electric car, electric motorbike, electric bus, electric train, electric boat, electric plane and the like. The market for electric vehicles has soared in recent years, with current estimates projecting over 5 million electric automobiles being sold each year by 2020.

Currently-produced electric vehicles are generally considered to be sustainable as they do not rely on fossil fuels which are in increasingly high demand in the world market. These electric vehicles are also considered environmentally safe as they do not generate any emissions such as greenhouse gasses.

However, even these sustainable electric vehicles currently being produced suffer from a number of shortcomings. Many of these vehicles are required to periodically be directly connected to the electric grid or require the usage of batteries for energy storage. When such batteries are utilized as the sole source of power, the range of the electric vehicle is severely limited by the storage capacity of the batteries and thus require repeated recharging. Increasing battery capacity, and thus vehicle range, increases both the price and the weight of the vehicle which, in many cases, can be suboptimal for different applications.

One solution to the problem of limited range of electric vehicles has been to develop a network of charging stations for use in recharging the battery systems on such vehicles. Another solution to increase range has been to use fuel cells instead of a large battery capacity. However, such systems often must rely on a complex hydrogen infrastructure and a network of hydrogen stations to provide points of delivery of hydrogen to refill the vehicles (much like gas stations). The necessary hydrogen infrastructure to support widely-used fuel cell vehicles is estimated to take several decades.

Another solution to the range problem with electric vehicles is to use directly sustainable energy such as solar energy to power the vehicles. Nonetheless, all of these solutions suffer many drawbacks compared to standard thermal engine vehicles, including range, usability, comfort and cost.

Because of the inherent problems with the related art, there is a need for a new and improved thermoelectric vehicle system which provides a cost-effective and sustainable means of transportation for long operation range with zero emission using an onboard low energy nuclear reaction thermal generator.

BRIEF SUMMARY OF THE INVENTION

The invention generally relates to a thermoelectric vehicle system which includes a thermal generator within a thermal enclosure case, an energy conversion system linked with the thermal generator, an energy storage system linked with the energy conversion system, a cooling system and a central control system. The thermal generator reacts nickel powder with hydrogen within a reactor chamber to produce heat. The heat is then transferred to the energy conversion system to be converted into electricity for storage in the energy storage system. The cooling system provides cooling for the various components of the present invention and the control system regulates its overall operation. The present invention may be utilized to power a vehicle in an efficient, sustainable and cost-effective manner.

There has thus been outlined, rather broadly, some of the features of the invention in order that the detailed description thereof may be better understood, and in order that the present contribution to the art may be better appreciated. There are additional features of the invention that will be described hereinafter and that will form the subject matter of the claims appended hereto. In this respect, before explaining at least one embodiment of the invention in detail, it is to be understood that the invention is not limited in its application to the details of construction or to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

Figure 1:
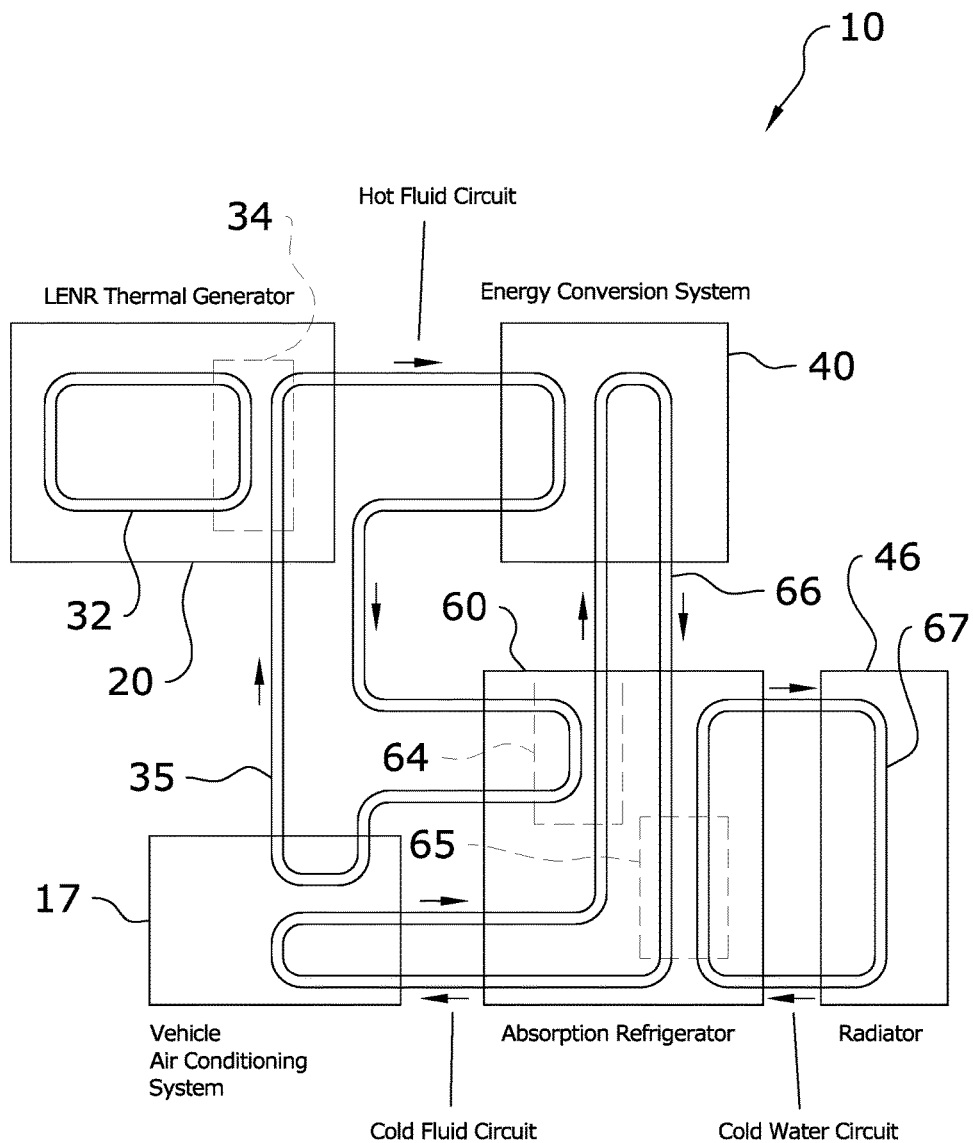
FIG. 1 is a first block diagram illustrating the overall components of a main embodiment of the present invention.

A. Overview.

Turning now descriptively to the drawings, in which similar reference characters denote similar elements throughout the several views, FIGS. 1 through 7 illustrate a thermoelectric vehicle system 10, which comprises a thermal generator 20 within a thermal enclosure case 30, an energy conversion system 40 linked with the thermal generator 20, an energy storage system 50 linked with the energy conversion system 40, a cooling system 60 and a central control system 70. The thermal generator 20 reacts nickel powder 23 with hydrogen within a reactor chamber 22 to produce heat. The heat is then transferred to the energy conversion system 40 to be converted into electricity for storage in the energy storage system 50 such as a battery. The cooling system 60 provides cooling for the various components of the present invention and the control system 70 regulates its overall operation.

Figure 2:
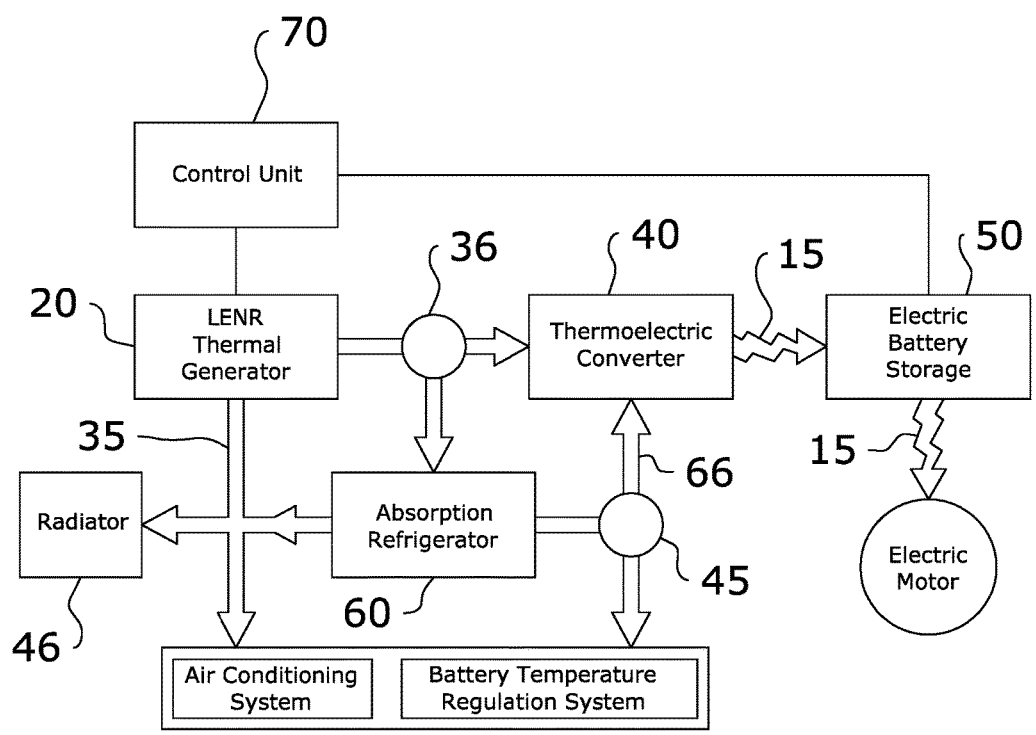
FIG. 2 is a second block diagram illustrating the overall components of a main embodiment of the present invention.

FIGS. 1 and 2 show block diagrams illustrating the overall structure and operation of the present invention. As seen in FIG. 1, the present invention comprises a thermal generator 20 having an internal fluid loop 32 driven by an internal hydraulic system 33. A hot fluid circuit 35 transfers heat from the thermal generator 20 to an energy conversion system 40, where heat is converted into energy and through a cooling system 60 before returning to the thermal generator 20. A cooling circuit 66 transfers through the energy conversion system 40, cooling system 60 and, optionally, through the vehicle's 16 A/C system 17. A cooling transfer circuit 67 also connects the cooling system 60 with a separate radiator 46. By utilizing low energy nuclear thermoelectric generation of the thermal generator 20, the present invention may be utilized to power a vehicle in an efficient, sustainable and cost-effective manner.

B. Thermal Generator.

Figure 3:
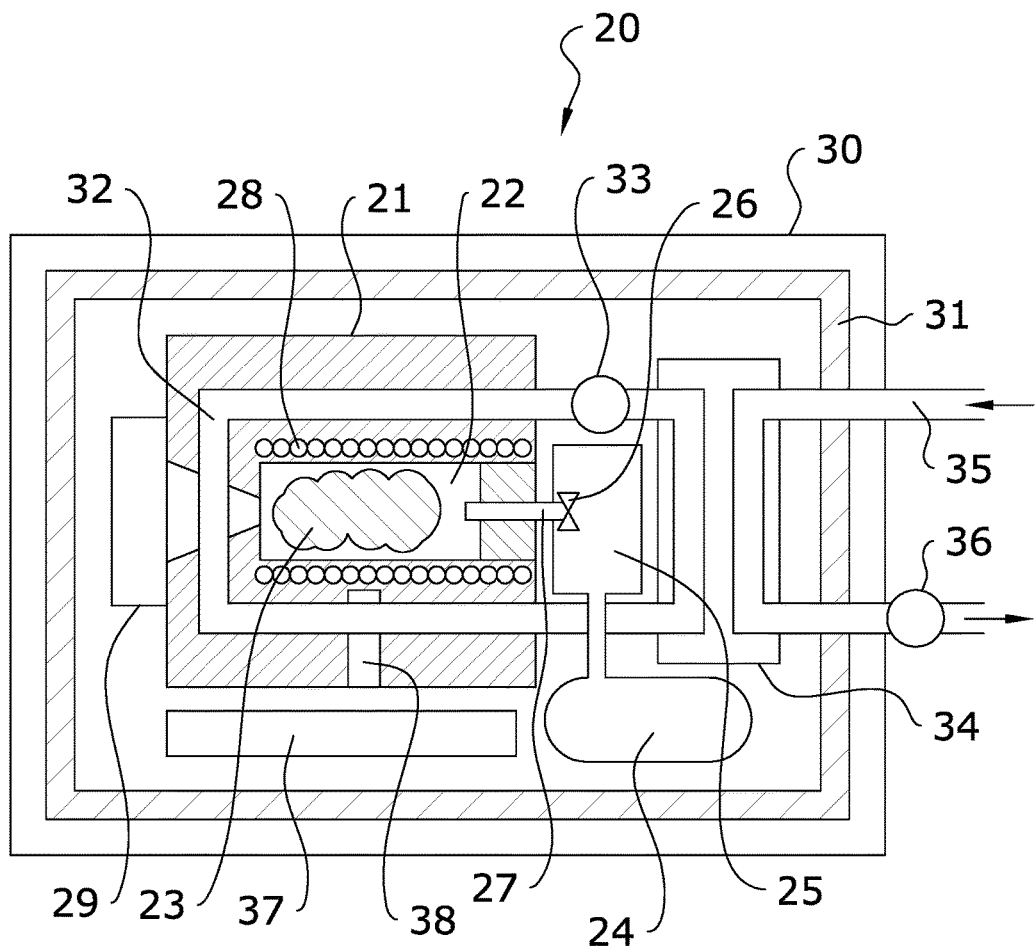
FIG. 3 is a block diagram illustrating a cross-sectional view of an exemplary thermal generator for use with the present invention.

The present invention utilizes a thermal generator 20 to produce power to be converted within the energy conversion system 40 and stored for use in the energy storage system 50. An exemplary thermal generator 20 is shown in FIG. 3. It is appreciated that this is merely an exemplary embodiment and it should thus be appreciated that various other embodiments may be utilized with the present invention. Thus, the configuration of the exemplary thermal generator 20 shown in the figures should not be construed as limiting the scope of the present invention thereto.

A wide range of thermal generators 20 may be utilized with the present invention. One such thermal generator 20 is disclosed within U.S. Patent Publication No. 2011/0005506 covering a "Method and Apparatus for Carrying out Nickel and Hydrogen Exothermal Reaction", which is hereby incorporated by reference. Another such thermal generator 20 is disclosed within U.S. Patent Publication No. 2011/0249783 covering a "Method for Producing Energy and Apparatus Therefor", which is hereby incorporated by reference.

Figure 4:
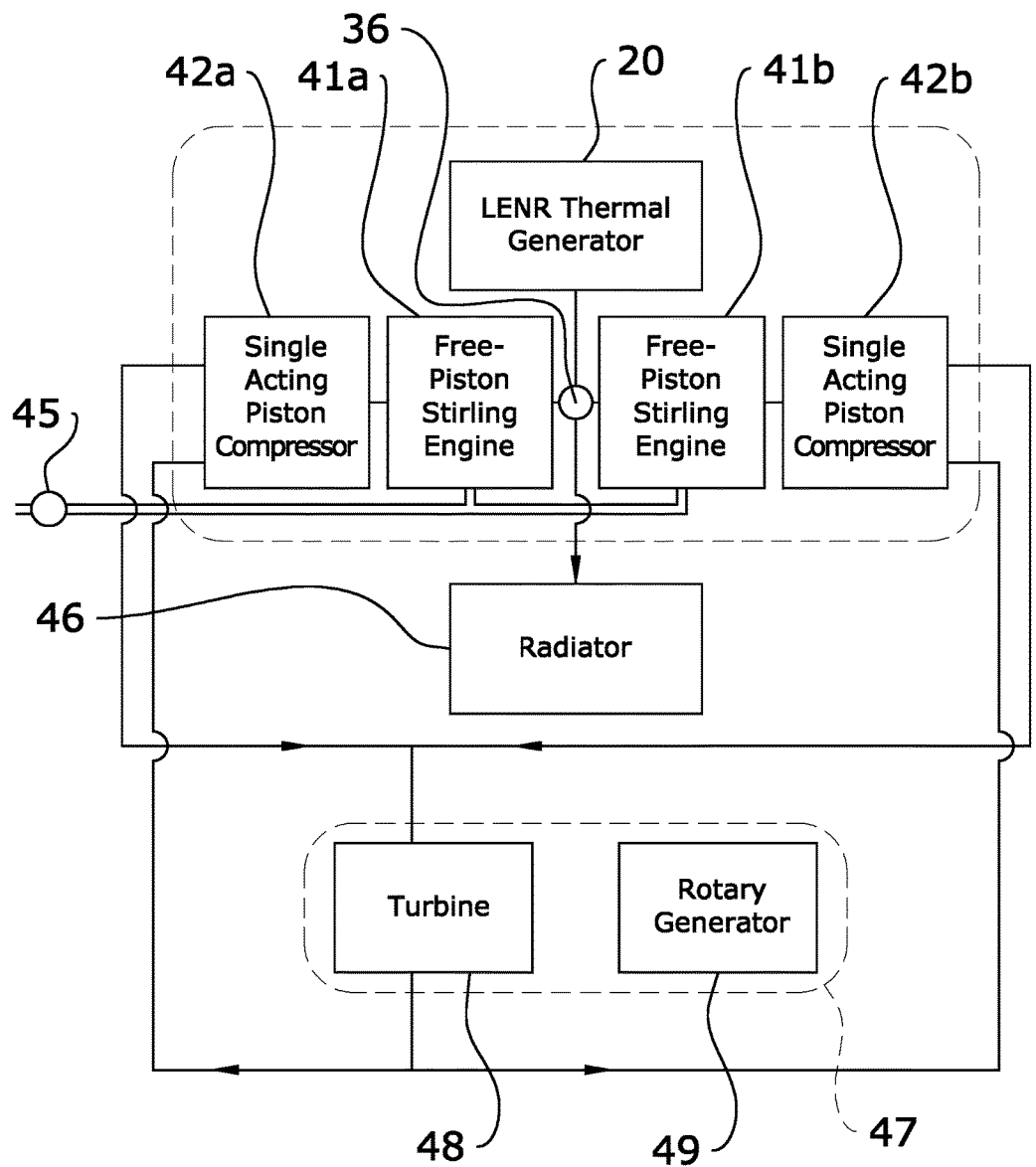
FIG. 4 is a block diagram illustrating the thermal generator and energy conversion systems of the present invention.

As shown in FIG. 4, the thermal generator 20 generally comprises a reactor chamber 22 storing a quantity of a reactant such a nickel powder 23 which is used as a main fuel of the reaction. A hydrogen storage tank 24 is provided such that the stored hydrogen may be injected into the reactor chamber 22 via a hydrogen injector 27. A gas pressurizer 25 is provided which is capable of pressurizing the hydrogen into the nickel powder 23 to enable and control the reaction. A heater 28 and radio frequency generator 29, such as a terahertz high frequency generator 39, are also provided for initiating and controlling the reaction.

The thermal generator 20 utilizes low energy nuclear reactions to produce heat for use in producing energy. The heat is produced based on the transmutation reactions of non-radioactive isotopes of the nickel powder 23 with gaseous hydrogen, which results in heavier stable isotopes of nickel and non-radioactive copper isotopes. Thus, the present invention does not require use of any radioactive fuel and produces no radioactive byproducts.

The thermal generator 20 is preferably encased within a thermal enclosure case 30 as shown in FIG. 3. A high density shield 31 is included within the case 30 which encloses the various components of the thermal generator 20 for safety purposes. The shield 31 is preferably comprised of a material capable of blocking any gamma rays emitted by the transmutations, as well as any inert gasses used for safety reasons.

The thermal generator 20 is generally comprised of a reactor chamber 22. The reactor chamber 22 is adapted to store a quantity of nickel powder 23 comprised of small particles of nickel 23. A hydrogen storage tank 24 is connected to the reactor chamber 22 via an injector 27 having a valve 26 therein. The hydrogen storage tank 24 stores hydrogen gas either in a pressurized form, such as within a bottle, or in a solid state such as in the form of potassium borohydride.

In embodiments utilizing a solid state of hydrogen, various types of metal hydrides may be utilized. The metal hydride is generally stored in the reactor chamber 22 of the thermal generator 20. Various types of metal hydrides may be utilized, including without limitation borohydrides, aluminum hydrides, and/or nickel hydrides. Exemplary types of borohydrides which could be utilized include without limitation potassium borohydride, lithium borohydride, and/or sodium borohydride. Exemplary types of aluminum hydrides which could be utilized include without limitation lithium aluminum hydride and/or sodium aluminum hydride. Exemplary types of nick hydrides which could be utilized include without limitation magnesium nickel hydride and lanthanum nickel hydride.

A gas pressurizer 25 controls the pressure and quantity of the hydrogen injected through the injector 27 into the reactor chamber 22 through use of a valve 26. Such a configuration allows for regulation of the activation and the quantity of transmutation reactions, thus allowing control of the amount of heat energy produced from the reactions within the chamber 22.

A heater 28, preferably comprised of an electric heater 28 is utilized in combination with a radio frequency generator 29 to initiate the reaction by increasing the temperature within the chamber 22 during the generator starting phase and to assist with regulating the amount of heat produced therein.

A control unit 37 is provided for specifically controlling the various components of the thermal generator 20 and thus its overall operation. The control unit 37 is preferably adapted to control the hydrogen input flow through the injector 27 (such as by control of the valve 26) as well as the radio frequency generator 29. The control unit 37 is also preferably adapted to measure the kernel 21 temperature through usage of an integrated temperature sensor 38.

Heat from the thermal generator 20 is transferred to the energy conversion system 40 of the present invention through usage of an internal fluid loop 32 powered by an internal hydraulic system 33, a heat exchanger 34 and an external fluid loop 35 powered by an external hydraulic system 36. The internal fluid loop 32 is comprised of a closed-cycle coolant fluid loop fully enclosed within the thermal enclosure case 30. The internal fluid loop 32 traverses through the casing of the reactor chamber 22 such that heat from the thermal reactions therein is transferred to the cooling fluid therein.

The heated cooling fluid is transferred within the internal fluid loop 32 through a heat exchanger 34 which is positioned within the enclosure case 30 as shown in FIG. 3. The heat exchanger 34 transfers the heat to the external fluid loop 35, comprised of a hot fluid circuit 35, to heat working fluid therein for conversion within the energy conversion system 40. The hot fluid circuit 35 may be adapted to transfer heat from the thermal generator 20 to the energy conversion system 40. Because all operations of the thermal generator 20 are worked in closed cycles, no emissions of any sort are produced other than negligible levels of gamma radiation which is on the same order of magnitude of natural background radiation.

It is appreciated that, in some embodiments, the thermal generator 20 and energy conversion system 40, which is described in more detail below, may be integrated into a single assembly wherein the heat from the thermal generator 20 is directly transferred to the energy conversion system 40 without need of any working or cooling fluids.

C. Energy Conversion System.

The present invention utilizes an energy conversion system 40 to convert the heat generated from the thermal generator 20 to energy. The energy conversion system 40 may be comprised of various configurations, such as a thermoelectric converter working in a closed cycle to transform the heat produced by the thermal generator 20 into electricity that can be stored in an energy storage system 50. In other embodiments, the energy conversion system 40 may be comprised of a thermo-kinetic converter which works in a closed cycle to transform the heat produced from the thermal generator into rotational motion that can be stored in the energy storage system 50.

The energy conversion system 40 of the present invention will generally comprise at least one Stirling engine 41 for producing linear motion from heat, at least one single-action piston compressor 42 or blower increasing the pressure of a working fluid from the linear motion of the Stirling engine 41, a turbine 48 producing a rotation motion from the pressurized fluid and a rotary electric generator 49 producing electricity from the turbine 48 rotation.

In a preferred embodiment as shown in FIG. 4, the energy conversion system 40 is comprised of a first Stirling engine 41a and a second Stirling engine 41b which are configured as dynamically balanced and opposed pairs to reduce vibrations and noise. The Stirling engines 41(a,b) receive heated working fluid from the external fluid loop 35 of the thermal enclosure case 30 which is driven by the external hydraulic system 36.

A first compressor 42a is connected to the first Stirling engine 41a and a second compressor 42b is connected to the second Stirling engine 41b as shown in FIG. 4. The compressors 42 are preferably comprised of single-acting piston compressors or blowers which are coupled to a turbogenerator 47 which itself includes a turbine 48 and rotary generator 49.

Heat from the thermal generator 20, transferred via the hot fluid circuit 35, powers each of the Stirling engines 41 by maintaining the expansion cylinder of both engines at a high temperature, while cooling fluid is transferred to the engines 41 via a cold hydraulic system 45 to maintain each compression cylinder at low temperature.

Stirling engines 41 are well known in the art and various configurations of the same known to be efficient in usage may be utilized with the present invention. Preferably, each Stirling engine 41 is comprised of a conventional, displacer type, free-piston engine 41 wherein a power piston drives a single-action piston compressor 42. The Stirling engines 41, compressors 42 and turbogenerator 47 all utilize the same working fluid, typically comprised of helium gas. The hydraulic systems 36, 45 regulate and control the temperature of the operation, and thus the efficiency of the energy conversion.

A radiator 46 is linked with the external hydraulic system 36 to evacuate all the remaining unused heat outside the electric vehicle. All operations of the energy conversion system are worked in a closed cycle to thus prevent any emissions of any type.

Multiple alternate embodiments have been considered by the inventor hereof with regard to the energy conversion system 40. For example, in one such alternate embodiment, the energy conversion system 40 could be comprised of a free-piston Stirling engine 41 producing linear motion from heat and a linear alternator producing electricity from the linear motion of the Stirling engine 41.

In another embodiment, the energy conversion system 40 may be comprised of a thermo-kinetic converter working in a closed cycle to transform heat produced by the thermal generator 20 into kinetic energy for storage in the energy storage system 50. Such a configuration would be comprised of a Stirling engine 41, a single compressor 42 increasing the pressure of a working fluid from the linear motion of the engine 41 and a turbine 48 producing a rotational motion from the pressurized fluid such that kinetic energy may be stored in a flywheel energy storage system 50.

Figure 8:
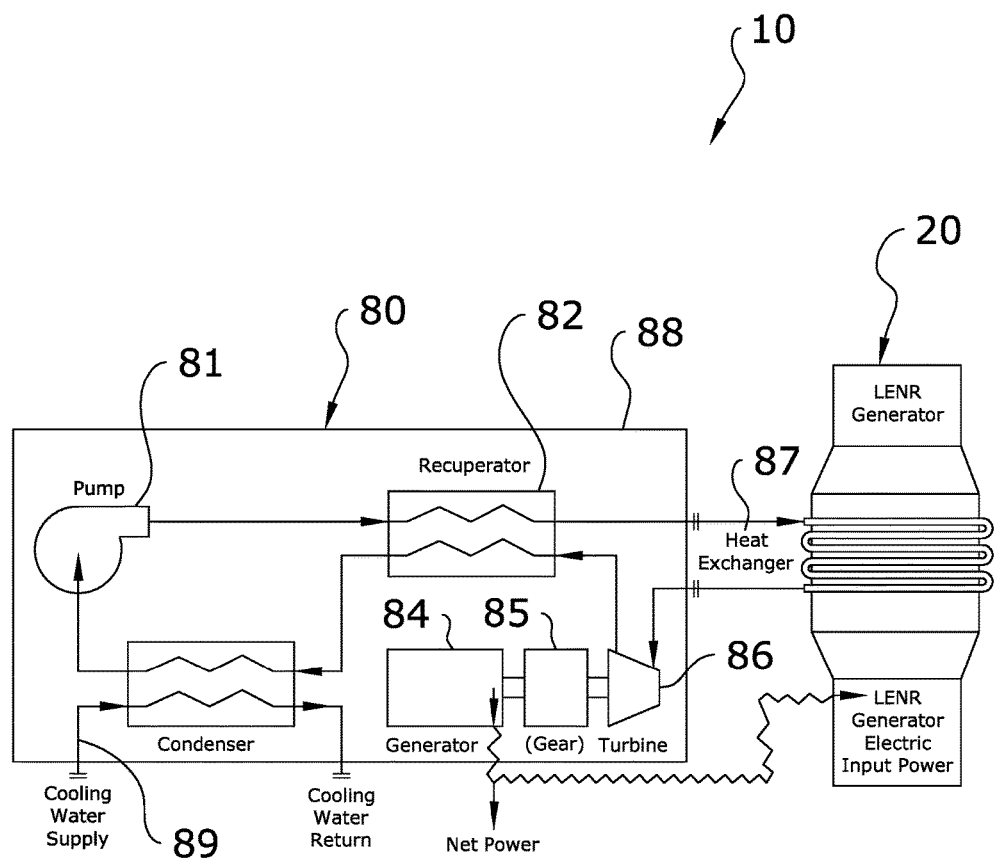
FIG. 8 is a block diagram illustrating an alternate embodiment of the present invention which utilizes a supercritical carbon dioxide turbogenerator.

In yet another embodiment, the energy conversion system 40 may be comprised of a steam turbogenerator including an evaporator transforming liquid water into high pressure steam using heat from working fluid, a turbine 48 producing a rotational motion from the high pressure steam, a rotary electric generator 49 producing electricity from the turbine rotation and a condenser using the cooling fluid to transform low pressure team exiting the turbine 48 back into liquid water to start the cycle back into the evaporator. Alternatively, the steam and liquid water may be replaced by supercritical carbon dioxide as working fluid as shown in FIG. 8.

In another alternate embodiment, the energy conversion system 40 may be comprised of a thermoelectric converter comprised of a waste heat Rankine cycle steam engine working in a closed cycle, such as is commonly known as a "Schoell Cycle" engine, which converts heat into a rotation motion which can be stored into the energy storage system 50 or converted into electricity.

Another alternate embodiment utilizes a thermoelectric converter comprised of a thermopile assembly using the "Seebeck" or "Peltier" effect to convert temperature differences between the heated transfer fluid and the cooling fluid into electric voltage.

A final alternate embodiment utilizes a Johnson thermoelectric energy converter comprised of a solid-state heat engine which relies on photodecomposition and recombination of hydrogen in a fuel cell using an approximate Ericsson cycle, thus producing electricity from heat.

D. Energy Storage System.

The present invention utilizes an energy storage system 50 to store the energy produced by the energy conversion system 40. Various types of energy storage systems 50 may be utilized with the present invention, including electric batteries, fly-wheel kinetic energy storage systems or combinations thereof.

In a preferred embodiment, the energy storage system 50 is comprised of an assembly of electric batteries adapted to store electricity produced by the conversion system 40. The working temperature of the batteries may be monitored with a thermometer and regulated with a battery temperature system which utilizes heat from heated working fluid and cooling from cooling fluid produced by the thermal generator 20 and cooling system 60, respectively.

E. Cooling System.

Figure 5:
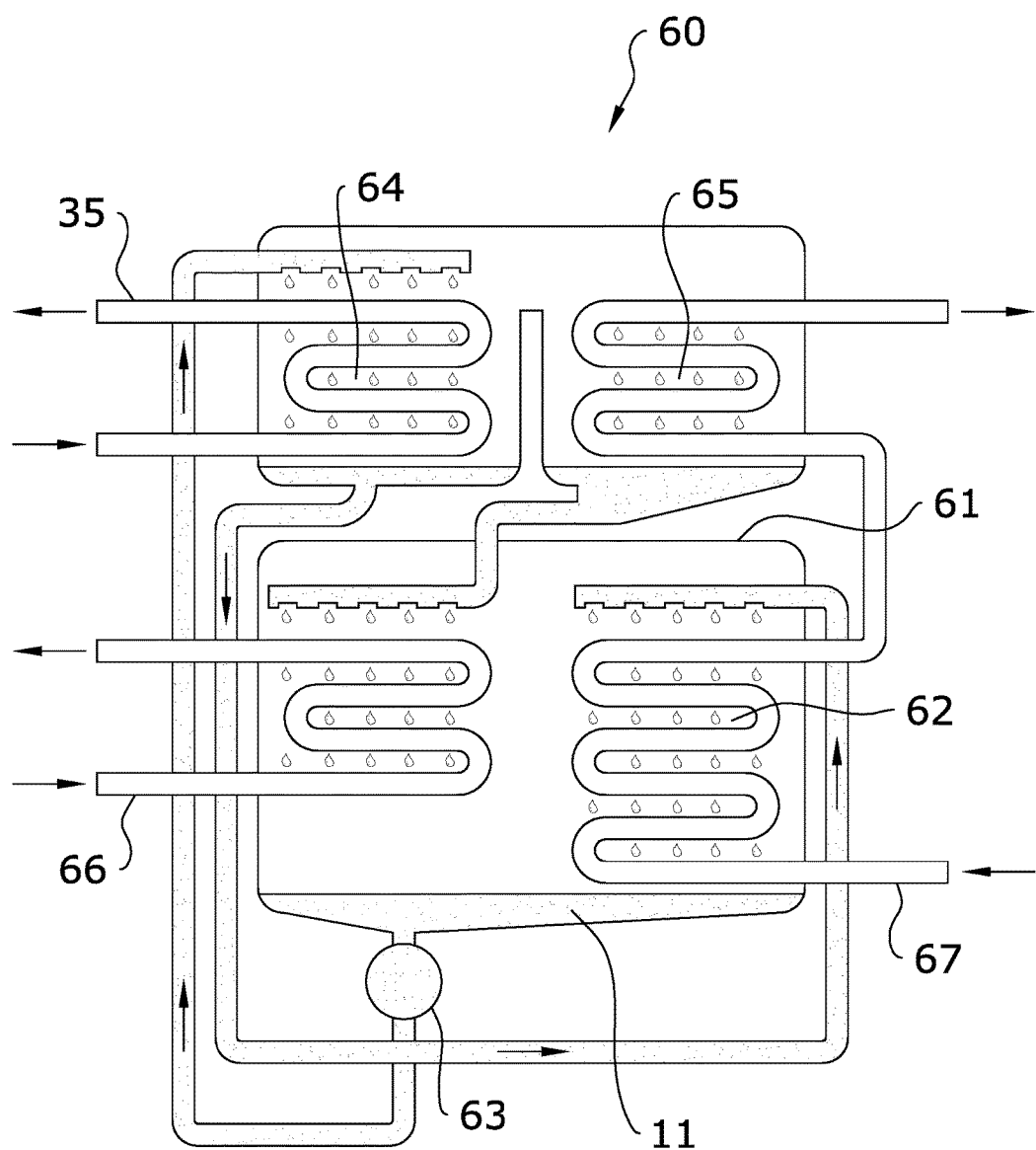
FIG. 5 is a block diagram illustrating a cooling system based on an absorption refrigerator.

FIG. 5 illustrates an exemplary embodiment of a cooling system 60 for use with the present invention. The cooling system 60 is preferably comprised of an absorption refrigerator which is used to produce useful cooling from the extra heat of the thermal generator 20 to improve the efficiency of the energy conversion system 40 and to provide a cooling source for regulation of temperature of the energy storage system 50 and, in some cases, an air conditioning system for the vehicle.

The cooling system 60 generally includes an evaporator 61 in which refrigerant fluid evaporates within a low partial pressure environment, thus extracting heat from its surroundings and refrigerating the cooling fluid. The gaseous refrigerant fluid is absorbed and dissolved into a liquid absorbing solution within an absorber 62, thus reducing its partial pressure within the evaporator 61 and allowing more liquid refrigerant fluid to evaporate.

The liquid absorbent solution is transferred via a pump 63 to a heat exchange boiler 64 where it is heated, causing the dissolved refrigerant fluid to evaporate out as shown in FIG. 5. The evaporated fluid is then condensed through a condenser 65 using cooling water to replenish the supply of liquid refrigerant fluid in the evaporator. The cooling system 60 utilizes both a cooling circuit 66 and cooling transfer circuit 67 to transfer fluid, and thus heat and cooling, into and out of the cooling system 60.

In an alternate embodiment, the cooling system 60 may be comprised of a passive or active water-air radiator. In the active embodiment, an electric fan may be used to improve the cooling performance of the cooling system 60.

In another alternate embodiment, the cooling system 60 may be comprised of a passive or active heat sink based on a heat exchanger using air or water available outside the electric vehicle as a cooling source.

F. Central Control System.

The present invention includes a central cooling system 70 for regulating the overall operation of the entire system 10. The control system 70 is capable of turning on the thermal generator 20 when the vehicle is being run or when the storage system 50 is below its maximum storage capacity. The control system 70 is also adapted to turn off the thermal generator 20 when the energy storage system 50 has reached its maximum storage capacity.

The control system 70 may be comprised of various embodiments. It will preferably be adapted to send commands to the thermal generator's 20 control unit 37 to turn on/off the thermal generator 20 to regulate the amount of produced heat. It will further be adapted to control the hydraulic systems 33, 36, 45 to organize the flows of heat transfer and cooling fluids throughout the present invention.

The control system 70 will also act to interact with the temperature regulation systems, such as that of the energy storage system 50, to increase or decrease battery temperature on demand. Finally, the control system 70 will interact with the air conditioning system of the vehicle to increase or decrease the air temperature within the vehicle.

G. Vehicles.

Figure 6A:
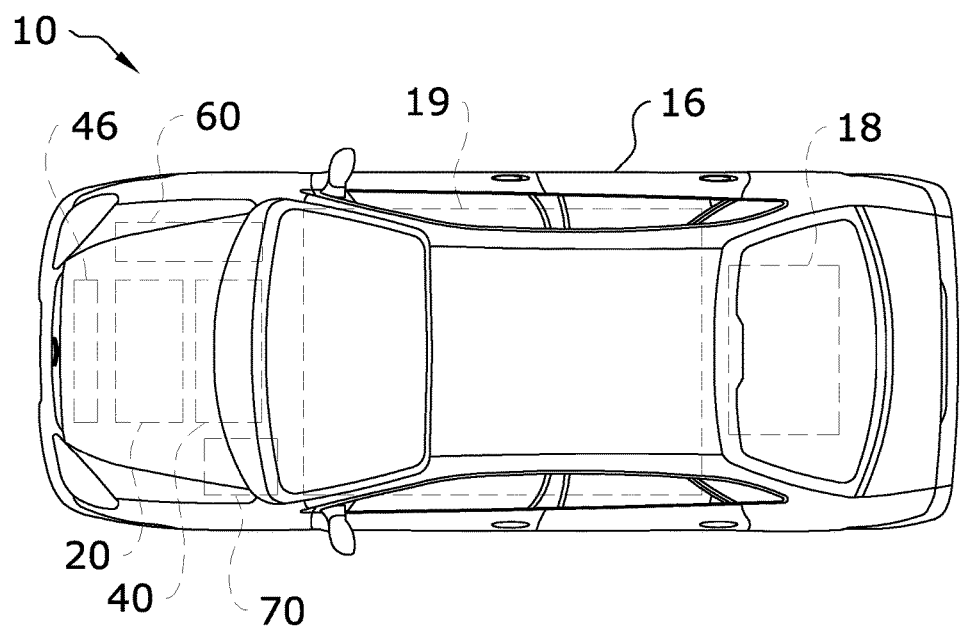
FIG. 6a is a top internal view of the various components of the present invention in use with an electrical automobile.
Figure 6B:
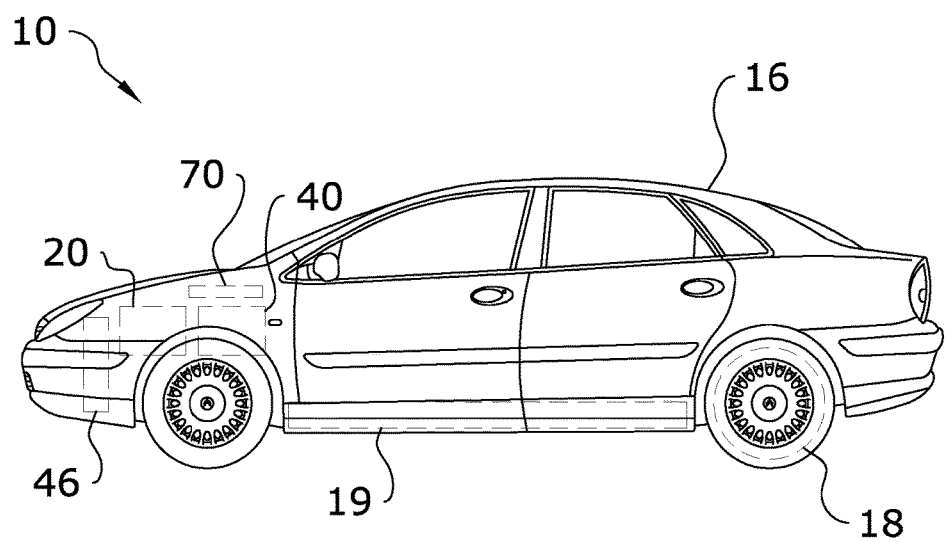
FIG. 6b is a side internal view of the various components of the present invention in use with an electrical automobile.
Figure 7:
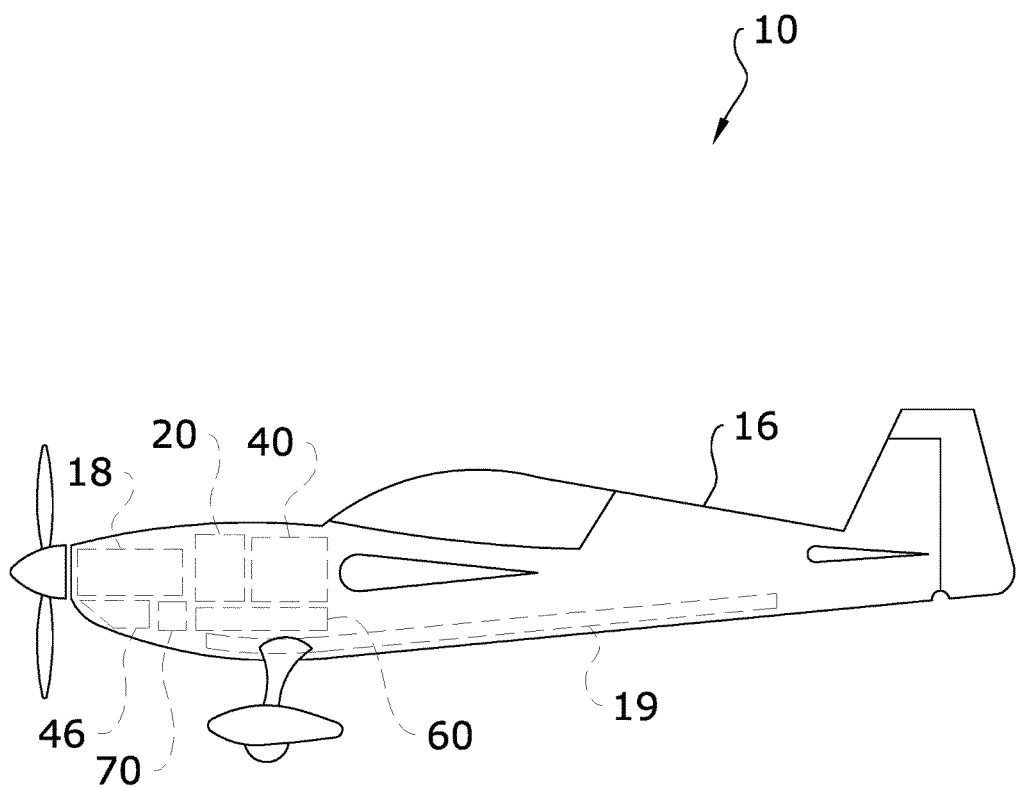
FIG. 7 is a side internal view of the various components of the present invention in use with an electrical aircraft.

The present invention may be utilized with a wide range of types of vehicles 16, such as busses, trucks, boats, trains, airplanes, helicopters, other aircraft and the like. The present invention is preferably adapted for use with an electric automobile 16, which hallows an extended operational range of several thousand miles per refueling. The weight of the vehicle 16 may be reduced by reducing the size and capacity of the batteries 19 needed to achieve the desired range, thus improving maneuverability and the relative performance of the vehicle. FIGS. 6a and 6b illustrate an exemplary embodiment of the present invention in use within an automobile. FIG. 7 illustrates an exemplary embodiment of the present invention in use within an aircraft.

The vehicle 16 will be designed to store the thermal generator 20, energy conversion system 40, energy storage system 50, cooling system 60 and central control system 70 within its cargo area. The present invention may be utilized to drive the vehicle's 16 electric motor 18 and to provide energy to be stored in the vehicle's 16 electric battery 19.

The present invention may also be utilized to increase efficiency of the vehicle's 16 air conditioning system 17 and/or regulate the temperature of the vehicle's 16 electric batteries 19. By utilizing excess heat generated by the thermal generator 20 in combination with extra cooling fluid, the temperature of the electric batteries 19 and/or air conditioning system 17 of the vehicle 16 may be regulated, often in combination with the central control system 70. Significant drawbacks to the operation of electric vehicles 16 may thus be reduced or eliminated entirely.

H. Operation of Alternate Embodiment.

FIG. 8 illustrates an alternate embodiment of the present invention in which a supercritical carbon dioxide turbogenerator 80 working as a closed Brayton cycle is utilized for the energy conversion functionality of the present invention. The Brayton cycle is well known in the art as a thermodynamic cycle used in connection with heat engines and closed-cycle gas turbines.

In the alternate embodiment of the present invention, the turbogenerator 80 is thermally linked with the thermal generator 20 of the present invention via a hot fluid circuit 35, 88 which, in combination with a heat exchanger 34, 87, transfers heat from the thermal generator 20 to the turbogenerator 80 to be converted to energy.

Various types of turbogenerators 80 may be utilized. A preferred embodiment is shown in FIG. 8, which comprises a pump 81, a recuperator 82, a turbine 86 and a condenser 83 all linked via the same hot fluid circuit 88 which is itself thermally linked via a heat exchanger 87 with the thermal generator 20 of the present invention. The pump 81 acts to force the supercritical fluid through the circuit 88.

The recuperator 82 is utilized to pre-heat the fluid before it enters the heat exchanger 34, 87 with the thermal generator 20. The recuperator 82 also pre-cools the fluid before it enters the condenser 83, which is linked via a cooling circuit 89 with a cooling water supply and cooling water return.

A gear 85 and generator 84 are connected to the turbine 86 to produce energy which may then be transferred to the energy storage system 50, electric motor 18, electric battery 19 and/or as supplemental power for the thermal generator 20.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods and materials are described above. All publications, patent applications, patents, and other references mentioned herein are incorporated by reference in their entirety to the extent allowed by applicable law and regulations. In case of conflict, the present specification, including definitions, will control. The present invention may be embodied in other specific forms without departing from the spirit or essential attributes thereof, and it is therefore desired that the present embodiment be considered in all respects as illustrative and not restrictive. Any headings utilized within the description are for convenience only and have no legal or limiting effect.

The invention claimed is:

1. A thermoelectric vehicle system, comprising:
   a vehicle, wherein said vehicle includes one or more electric motors and one or more electric batteries;
   a thermal generator adapted to produce heat through a reaction of nickel powder with hydrogen, wherein said thermal generator is comprised of a reactor chamber, wherein said hydrogen comprises a volume of hydrogen in a solid state stored inside the reactor chamber, wherein said thermal generator is further comprised of a heating system, a high frequency generator and heat exchanger system adapted to transfer heat away through a hot fluid circuit;
   a central control system;
   an energy conversion system adapted to convert heat generated by said thermal generator into electricity, said energy conversion system comprising at least one Stirling engine for producing linear motion from the heat, at least one single-action piston compressor or blower increasing the pressure of a working fluid from the linear motion of the Stirling engine, a turbine producing a rotation motion from the pressurized fluid and a rotary electric generator producing electricity from the turbine rotation,
   a hot fluid circuit for transferring heat from said thermal generator to said energy conversion system; and
   an energy storage system for storing said electricity for powering said vehicle, said energy storage system being connected so as to power said one or more electric motors.

2. The thermoelectric vehicle system of claim 1, wherein said vehicle is comprised of a vehicle selected from the group consisting of an electric automobile, an electric airplane, an electric boat and an electric train.

3. The thermoelectric vehicle system of claim 1, wherein said volume of hydrogen in a solid state is selected from the group consisting of a borohydride, an aluminum hydride, and a nickel hydride.

4. The thermoelectric vehicle system of claim 1, wherein said volume of hydrogen in a solid state is selected from the group consisting of potassium borohydride, lithium borohydride, and sodium borohydride.

5. The thermoelectric vehicle system of claim 1, wherein said volume of hydrogen in a solid state is selected from the group consisting of lithium aluminum hydride and sodium aluminum hydride.

6. The thermoelectric vehicle system of claim 1, wherein said volume of hydrogen in a solid state is selected from the group consisting of magnesium nickel hydride and lanthanum nickel hydride.

7. The thermoelectric vehicle system of claim 1, wherein said energy conversion system is comprised of a steam turbine and an electric generator.

8. The thermoelectric vehicle system of claim 1, wherein said energy conversion system is comprised of a steam piston engine and an electric generator.

9. The thermoelectric vehicle system of claim 1, wherein said energy conversion system is comprised of a free piston Stirling generator.

10. The thermoelectric vehicle system of claim 1, wherein said hot fluid circuit is controlled by said central control system.

11. The thermoelectric vehicle system of claim 10, wherein said hot fluid circuit is adapted to cool down said thermal generator.

12. The thermoelectric vehicle system of claim 11, wherein said hot fluid circuit is adapted to regulate an output of said thermal generator.

13. The thermoelectric vehicle system of claim 1, wherein said high frequency generator is adapted to generate frequencies in the terahertz range.

14. The thermoelectric vehicle system of claim 1, wherein said thermal generator is encased within a thermal enclosure case.

15. The thermoelectric vehicle system of claim 14, wherein said thermal enclosure case comprises a high density shield.

16. The thermoelectric vehicle system of claim 15, wherein said thermal generator includes an internal fluid loop for transferring heat within said thermal generator.

17. The thermoelectric vehicle system of claim 1, wherein said thermal generator is thermally linked with said one or more electric batteries.

18. The thermoelectric vehicle system of claim 1, wherein said cooling circuit is thermally linked with said one or more electric batteries.

19. The thermoelectric vehicle system of claim 18, wherein said central control system is adapted to condition a temperature of said one or more electric batteries using at least a portion of heat produced by said thermal generator and at least a portion of a cooling fluid of said cooling circuit to regulate said temperature of said one or more electric batteries.

20. A thermoelectric vehicle system, comprising:
   a vehicle, wherein said vehicle includes one or more electric batteries and wherein said vehicle includes an air conditioning system;
   a thermal generator adapted to produce heat through a reaction of nickel powder with hydrogen, wherein said thermal generator is comprised of a reactor chamber, wherein said hydrogen comprises a volume of hydrogen in a solid state stored inside the reactor chamber, wherein said thermal generator is further comprised of a heating system, a high frequency generator and heat exchanger system adapted to transfer heat away through a hot fluid circuit, wherein said thermal generator is encased within a thermal enclosure case, said thermal enclosure case including a high density shield, wherein said thermal generator includes an internal fluid loop for transferring heat within said thermal generator;

a central control system;

an energy conversion system adapted to convert heat generated by said thermal generator into electricity, said energy conversion system being comprised of a first Stirling engine and a second Stirling engine for producing linear motion from heat, a first single-action piston compressor and a second single-action piston compressor for increasing the pressure of a working fluid, a turbine and a rotary electric generator, wherein said first single-action piston compressor is connected to said first Stirling engine and wherein said second single-action piston compressor is connected to said second Stirling engine;

a hot fluid circuit for transferring heat from said thermal generator to said energy conversion system;

an energy storage system for storing said electricity for powering said vehicle;

a cooling system for cooling said energy conversion system; and a cooling circuit linked between said energy conversion system and said cooling system;

wherein said thermal generator is thermally linked with said air conditioning system, wherein said cooling circuit is thermally linked with said air conditioning system and wherein said central control system is adapted to direct transfer of at least a first portion of said heat produced by said thermal generator to said air conditioning system for providing hot air to said air conditioning system;

wherein said thermal generator is thermally linked with said one or more electric batteries, wherein said cooling circuit is thermally linked with said one or more electric batteries, wherein said central control system is adapted to condition a temperature of said one or more electric batteries using at least a second portion of said heat produced by said thermal generator and at least a portion of a cooling fluid of said cooling circuit to regulate said temperature of said one or more electric batteries.

* * * * *